(12) United States Patent
Jaworski et al.

(10) Patent No.: US 8,415,759 B2
(45) Date of Patent: Apr. 9, 2013

(54) DOWN-CONVERTING AND DETECTING PHOTONS

(75) Inventors: Frank B. Jaworski, Goleta, CA (US); Moungi Bawendi, Cambridge, MA (US); Scott M. Geyer, Cambridge, MA (US)

(73) Assignee: Raytheon Company, Waltham, MA (US)

( * ) Notice: Subject to any disclaimer, the term of this patent is extended or adjusted under 35 U.S.C. 154(b) by 221 days.

(21) Appl. No.: 12/952,330

(22) Filed: Nov. 23, 2010

(65) Prior Publication Data
US 2012/0126354 A1 May 24, 2012

(51) Int. Cl.
*H01L 31/0232* (2006.01)
(52) U.S. Cl. .............. 257/432; 257/E31.954; 438/69; 977/954; 977/773
(58) Field of Classification Search .............. 257/432, 257/E31.954; 438/69; 977/954, 773
See application file for complete search history.

(56) References Cited

U.S. PATENT DOCUMENTS

| | | | |
|---|---|---|---|
| 5,446,286 A | 8/1995 | Bhargava | |
| 5,613,140 A | 3/1997 | Taira | |
| 6,287,928 B1 | 9/2001 | Yamashita | |
| 6,525,337 B1 | 2/2003 | Ugajin et al. | |
| 6,632,694 B2 | 10/2003 | Torvik | |
| 6,927,422 B2 | 8/2005 | Torvik | |
| 7,015,139 B2 | 3/2006 | Yamashita | |
| 7,449,789 B2 | 11/2008 | Chen | |
| 7,662,659 B2 | 2/2010 | Kobayashi et al. | |
| 7,737,046 B2 | 6/2010 | Takeda et al. | |
| 2011/0019055 A1 | 1/2011 | Jaworski et al. | |
| 2011/0024612 A1 | 2/2011 | Mintz et al. | |
| 2011/0141453 A1 | 6/2011 | Clement et al. | |
| 2011/0308605 A1* | 12/2011 | Liu et al. .................. | 136/257 |
| 2012/0080066 A1* | 4/2012 | Tsakalakos et al. ......... | 136/244 |

FOREIGN PATENT DOCUMENTS
WO 9928764 A1 6/1999

OTHER PUBLICATIONS

Luther, Joseph M. et al., "Structural, Optical, and Electrical Properties of Self-Assembled Films of PbSe Nanocrystals Treated with 1,2-Ethanedithiol", ACS NANO, Col. 2, No. 2, Feb. 1, 2008.

* cited by examiner

*Primary Examiner* — Trung Q Dang
(74) *Attorney, Agent, or Firm* — Lando & Anastasi, LLP

(57) ABSTRACT

In certain embodiments, an apparatus for down-converting and detecting photons includes a detector layer and a nanocrystal layer. The nanocrystal layer includes nanocrystals operable to absorb first photons of a higher energy and emit second photons of a lower energy in response to the absorption. The detector layer is configured to detect the second photons. In certain embodiments, a method for manufacturing an apparatus for down-converting and detecting photons includes preparing an outer surface of a substrate. Nanocrystals are disposed outwardly from the outer surface. The nanocrystals are operable to absorb first photons of a higher energy and emit second photons of a lower energy in response to the absorption.

17 Claims, 1 Drawing Sheet

DOWN-CONVERTING AND DETECTING PHOTONS

GOVERNMENT FUNDING

The U.S. Government may have certain rights in this invention as provided for by the terms of Contract No. 571-000-2396 MOD 001 awarded by the U.S. Army.

TECHNICAL FIELD

This invention relates generally to the field of photon detection and more specifically to down-converting and detecting photons.

BACKGROUND

Ultraviolet (UV) detectors use UV focal planes to detect UV light. Typically, a UV focal plane requires a large band gap semiconductor so UV photons may produce a photocurrent without first being absorbed by the semiconductor. In certain situations, fabricating such a UV focal plane may be difficult.

SUMMARY OF THE DISCLOSURE

In accordance with the present invention, disadvantages and problems associated with previous techniques for photon detection may be reduced or eliminated.

In certain embodiments, an apparatus for down-converting and detecting photons includes a detector layer and a nanocrystal layer. The nanocrystal layer includes nanocrystals operable to absorb first photons of a higher energy and emit second photons of a lower energy in response to the absorption. The detector layer is configured to detect the second photons.

In certain embodiments, a method for manufacturing an apparatus for down-converting and detecting photons includes preparing an outer surface of a substrate. Nanocrystals are disposed outwardly from the outer surface. The nanocrystals are operable to absorb first photons of a higher energy and emit second photons of a lower energy in response to the absorption.

Certain embodiments of the invention may provide one or more technical advantages. A technical advantage of one embodiment may be that nanocrystals may be used to down-covert photons of a higher energy to photons of a lower energy. A detector may detect the lower energy photons. The detected lower energy photons may be used to generate an image corresponding to the higher energy photons.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
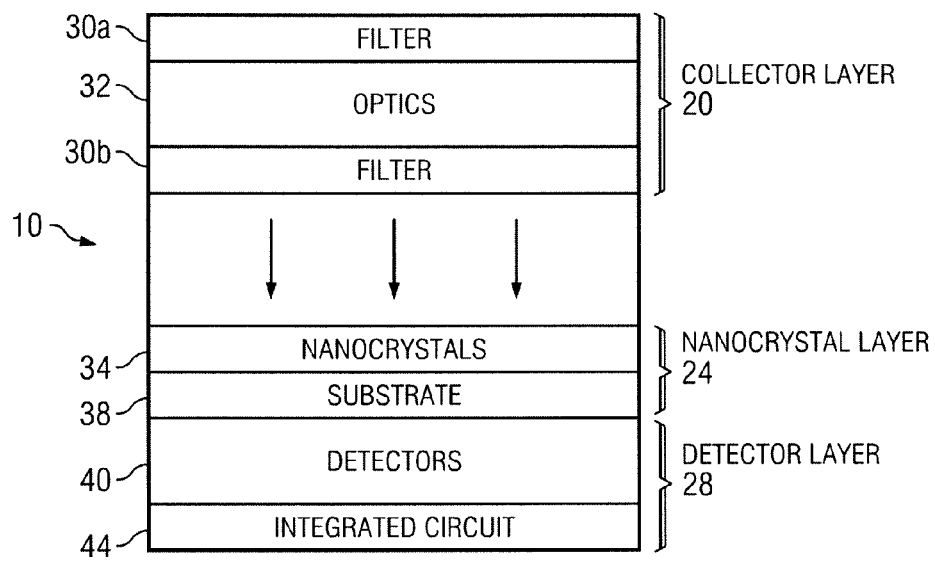
FIG. 1 illustrates an embodiment of an apparatus that may be used to down-convert and detect photons.
Figure 2A:
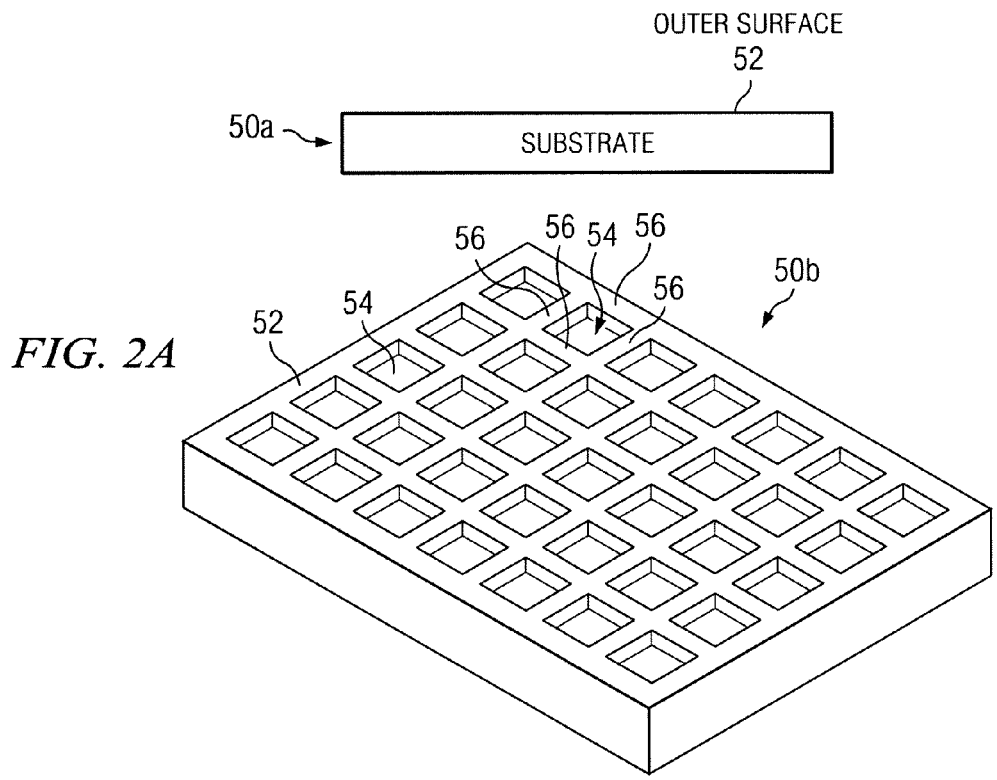
FIGS. 2A and 2B illustrate an example of a method for manufacturing the apparatus of FIG. 1.
Figure 2B:
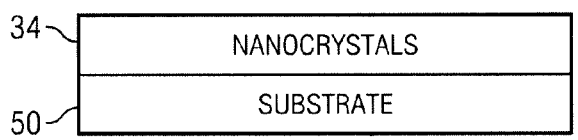

Embodiments of the present invention and its advantages are best understood by referring to FIGS. 1 through 2B of the drawings, like numerals being used for like and corresponding parts of the various drawings.

FIG. 1 illustrates an embodiment of an apparatus 10 that may be used to down-convert and detect photons. In the illustrated example, apparatus 10 includes a collector layer 20, a nanocrystal layer 24, and a detector layer 28, such as a focal plane array. Nanocrystal layer 24 is disposed outwardly from and coupled to detector layer 28, and collector layer 20 is disposed from and coupled to nanocrystal layer 24. Collector layer 20 includes one or more filters 30 (30a-b) and one or more optics 32. Nanocrystal layer 24 includes nanocrystals 34 disposed outwardly from a substrate 38. Substrate 38 may be distinct from or may be a portion of detector layer 28. Detector layer 28 includes one or more detectors 40 disposed outwardly from one or more integrated circuits 44.

In certain situations, apparatus 10 may receive photons of a higher energy from a scene. The scene includes one or more objects that can emit and/or reflect the photons. Nanocrystals 34 of nanocrystal layer 28 down-convert the higher energy photons to photons of a lower energy. For example, nanocrystals 34 absorb the higher energy photons and emit the lower energy photons in response to the absorption. Detector layer 28 detects the lower energy photons and may generate image data that can be used to generate an image of the scene. In these situations, apparatus 10 may use a detector that detects the lower energy photons to generate an image from the higher energy photons.

In these embodiments, apparatus 10 may be regarded as implementing a dual band detection scheme. Detectors 40 detect not only the photons within their normal detection band, but also detect, via the down conversion process, higher energy photons outside of the normal detection band. The dual band detection scheme may be implemented without any additional complications such as added electronics or increased power dissipation.

The higher and lower energy photons may have any suitable energies. Examples of energies include energies that may be found in the ranges that correspond to infrared (IR), visible, and/or ultraviolet (UV) light. Any suitable higher energy photons may be detected using a detector that detects any suitable lower energy photons. For example, UV photons may be detected using an IR detector, UV photons may be detected using a visible light detector, and/or visible light may be detected using an IR detector.

In certain embodiments, collector layer 20 is disposed outwardly from nanocrystal layer 28 and is configured to direct the higher energy photons towards nanocrystal layer 28. Collector layer 20 may include optics 32 and/or one or more filters 30 arranged in any suitable manner. For example, optics 32 may be disposed between filters 30, optics 32 may be disposed outwardly from one or more filters 30, or one or more filters 30 may disposed outwardly from optics 32.

In certain embodiments, optics 32 may include one or more optical devices that are configured to transmit and direct photons. Examples of optics 32 may include a lens and/or optical fibers. In certain embodiments, filter 30 is configured to transmit the higher energy photons and block the lower energy photons. Examples of filters 30 may include UV, visible light, and/or IR filters.

Nanocrystal layer 24 comprises nanocrystals 34 disposed outwardly from substrate 38. In certain embodiments, substrate 38 may be omitted such that nanocrystals 34 are disposed directly outwardly from detectors 40 of detector layer 28. Examples of substrate 38 are described in more detail with reference to FIG. 2A.

A nanocrystal 34 is a semiconductor nano-material object that is confined in one, two, or three spatial dimensions to invoke quantum confinement effects that are not seen in a bulk semiconductor. For example, a nanocrystal 34 may have fluorescence. A nanocrystal 34 may have any suitable size as long as quantum confinement effects are established, for example, a diameter having a value in the range of 2 to 4, 4 to 6, 6 to 8, or 8 to 10 nanometers (nm), or even less than 2 nm or greater than 10 nm. In certain embodiments, a smaller nanocrystal 34 may yield a higher energy down-converted photon, and larger nanocrystal 34 may yield a lower energy down-converted photon. In certain examples, larger nanocrystals 34 may yield a down-conversion from UV photons to IR photons, and smaller nanocrystals may yield a down-conversion from UV photons to green photons.

Any suitable nanocrystals 34 emitting any suitable wavelength may be used. Examples of nanocrystals 34 include quantum dots, core/shell quantum dots, nanorods, tetrapods, and nanobarbells. For example, nanocrystals 34 may be lead sulfide (PbS) Q dots emitting wavelengths around 1400 nanometers. In certain embodiments, nanocrystals 34 may be colloidal Q dots.

In certain embodiments, nanocrystals 34 receive higher energy photons from a scene, which create excitons inside of nanocrystals 34. The excitons recombine and emit the lower energy photons. The amount of light of the lower energy photons is proportional to the intensity of the higher energy photons.

In certain embodiments, detector layer 28 includes detectors 40 disposed outwardly from any suitable circuit, such as readout integrated circuit (ROIC) 44. In certain embodiments, detector layer 28 may be omitted, and the lower energy photons may be viewed by a user. In certain embodiments, corrals or other suitable structures may be formed outwardly from detector layer 28. Examples of corrals are described in more detail with reference to FIG. 2A.

In certain embodiments, a detector 40 and ROIC 44 is configured to detect the lower energy photons and generate an electrical signal in response to the detection. Detectors 40 may include any suitable detectors with any suitable wavelength detection band and are arranged in any suitable manner. Examples of detectors 40 include IR, visible, and/or UV detectors, that may include a complementary metal-oxide-semiconductor (CMOS), charge-coupled device (CCD) active-pixel sensor (APS), photodiode, photocathode, phototube, or other suitable light detection device such as film. Detectors 40 may be arranged as an array, such as a focal plane array (FPA). For example, a short wave infrared focal plane array may be used.

In certain embodiments, integrated circuit 44 is configured to detect the photocurrent emitted in response to detecting the lower energy photons and generate image data from the photocurrent. The image data may be processed to yield an image of the objects of the scene.

In certain embodiments, apparatus 10 may be a pixilated detector. In these embodiments, nanocrystal layer 24 covers certain pixels, but not other pixels, to resolve different wavelengths of light independently. For example, ½, ⅓, ¼ of the pixels may be covered (or uncovered), and the other pixels may be uncovered (or covered).

FIGS. 2A and 2B illustrate an example of a method for manufacturing embodiments of apparatus 10. In certain embodiments, the method may include preparing an outer surface of a substrate and disposing nanocrystals outwardly from the outer surface of the substrate.

FIG. 2A illustrates examples of substrates 50 (50a-b) for which an outer surface 52 may be prepared. Substrate 50a may comprise any suitable substrate. In certain embodiments, substrate 50a may comprise detector layer 28 such that nanocrystals 34 are applied directly to detectors 40 of detector layer 28.

In certain embodiments, substrate 50a may comprise a base substrate configured to transmit the lower energy photons. The base substrate may comprise any suitable material that can transmit the lower energy photons, for example, a glass and/or quartz.

Embodiments of nanocrystal layer 24 with nanocrystals 34 disposed outwardly from the base substrate may be used in any suitable manner. For example, nanocrystal layer 24 may be detachably coupled to detector layer 28 such that the layers may be readily separated from each other. In another example, nanocrystal layer 24 may be substantially permanently attached to detector layer 28. In yet another example, a user can view the lower energy photons directly from nanocrystal layer 24. For example, a user may detect lower energy photons in the visible range directly through the base substrate. An eye may be regarded as a detector 40.

A substrate 50 may have an outer surface 52 from which nanocrystal layer 24 may be outwardly disposed. In certain embodiments, outer surface 52 may be the surface at which detectors 40 of detector layer 28 receive the lower energy photons. Outer surface 52 may be prepared in any suitable manner. For example, outer surface 52 may be cleaned.

Substrate 50b illustrates another example of surface preparation. In the example, corrals 54 are formed outwardly from outer surface 52 such that a resulting surface includes corrals 54. A corral 54 may be a surface formation that may hold nanocrystals 24 within its raised borders 56. Border 56 may surround nanocrystals 24 in substantially planar manner such that border 56 defines a plane. In certain embodiments, border 56 reflects photons such as higher and/or lower energy photons. For example, reflecting the lower energy down-converted photons may reduce cross-reflection and increase intensity. A corral 54 may have any suitable shape or size. As an example, corral 54 may have a rectangular or square shape and dimensions of 5u to 20u. In certain embodiments, a corral 54 may be substantially similar in size and/or shape to a pixel.

Corrals 54 may be formed in any suitable manner. For example, a metallization process may be used to form borders 56. A metal (such as gold, aluminum, or titanium) may be outwardly deposited from outer surface 52 where borders are desired. For example, typical focal plane dimensions range from a few millimeters to several centimeters in size.

FIG. 2B illustrates deposition of nanocrystals 34 outwardly from outer surface 52. Nanocrystals 34 may be disposed outwardly from outer surface 52 in any suitable manner. In certain embodiments, a suspension comprising nanocrystals 34 may be drop-cast onto outer surface 52. In these embodiments, a nanocrystal 34 colloidal solution may be dropped onto outer surface 52. In other embodiments, nanocrystals 34 may be spin-coated onto outer surface 52. In these embodiments, an excess of nanocrystal 34 solution may be placed on outer surface 52, which is then rotated at high speed to spread the solution by centrifugal force.

The method may include any other suitable additional and/or alternative steps. In certain embodiments, the method may include identifying a desired down-conversion from the higher energy photons to the lower energy photons and selecting the nanocrystals according to the desired down-conversion. In the embodiments, larger nanocrystals may be selected for a greater down-conversion, and smaller nanocrystals may be selected for a smaller down-conversion.

In certain embodiments, the method may include disposing collector layer 20 outwardly from nanocrystal layer 24. Collector layer 20 may direct the higher energy photons towards nanocrystal layer 24 and may be attached or coupled to nanocrystal layer 24. In certain embodiments, the method may include disposing a filter 30 outwardly from nanocrystal layer 24. Filter 30 may transmit the higher energy photons and block the lower energy photons. Filter 30 may be attached or coupled to nanocrystal layer 24.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

A component of the systems and apparatuses disclosed herein may include an interface, logic, memory, and/or other suitable element. An interface receives input, sends output, processes the input and/or output, and/or performs other suitable operation. An interface may comprise hardware and/or software.

Logic performs the operations of the component, for example, executes instructions to generate output from input. Logic may include hardware, software, and/or other logic. Logic may be encoded in one or more tangible media and may perform operations when executed by a computer. Certain logic, such as a processor, may manage the operation of a component. Examples of a processor include one or more computers, one or more microprocessors, one or more applications, and/or other logic.

In particular embodiments, the operations of the embodiments may be performed by one or more computer readable media encoded with a computer program, software, computer executable instructions, and/or instructions capable of being executed by a computer. In particular embodiments, the operations of the embodiments may be performed by one or more computer readable media storing, embodied with, and/or encoded with a computer program and/or having a stored and/or an encoded computer program.

A memory stores information. A memory may comprise one or more non-transitory, tangible, computer-readable, and/or computer-executable storage media. Examples of memory include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. An apparatus comprising:
   a detector layer having a detection band and configured to receive and detect a plurality of third photons within the detection band; and
   a nanocrystal layer coupled to the detector layer and comprising:
      a plurality of nanocrystals operable to:
         absorb a plurality of first photons of a higher energy outside of the detection band of the detector layer; and
         emit a plurality of second photons of a lower energy within the detection band of the detector layer in response to the absorption; and
   the detector layer further configured to detect the plurality of first photons by detecting the plurality of second photons.

2. The apparatus of claim 1, further comprising:
   a collector layer configured to:
      direct the plurality of first photons towards the nanocrystal layer.

3. The apparatus of claim 1, the nanocrystal layer configured to surround a subset of the nanocrystals.

4. The apparatus of claim 1, the nanocrystal layer configured to reflect the plurality of first or second photons.

5. The apparatus of claim 1, the detector layer comprising:
   one or more detectors, each detector configured to:
      detect one or more second photons and one or more third photons; and
      generate an electrical signal in response to the detection.

6. The apparatus of claim 1, the detector layer comprising:
   a circuit configured to:
      detect a photocurrent emitted in response to detecting the plurality of third photons and the plurality of second photons; and
      generate image data from the photocurrent.

7. A method comprising:
   preparing an outer surface of a substrate;
   disposing a plurality of nanocrystals outwardly from the outer surface of the substrate, the nanocrystals operable to absorb a plurality of first photons of a higher energy and to emit a plurality of second photons of a lower energy in response to the absorption;
   identifying a desired down-conversion from the first photons to the second photons; and
   selecting the plurality of nanocrystals according to the desired down-conversion, larger nanocrystals selected for a greater down-conversion, smaller nanocrystals selected for a smaller down-conversion.

8. The method of claim 7, the substrate comprising:
   a base substrate configured to transmit the plurality of second photons.

9. The method of claim 7, the substrate comprising:
   a detector layer configured to detect the plurality of second photons.

10. The method of claim 7, the preparing the outer surface further comprising:
    preparing the outer surface to surround a subset of the nanocrystals and to reflect the plurality of first photons.

11. The method of claim 7, the preparing the outer surface further comprising:
    depositing metal outwardly from the outer surface to prepare the outer surface to surround a subset of the nanocrystals and to reflect the plurality of first photons.

12. The method of claim 7, the disposing the plurality of nanocrystals further comprising:
drop-casting a suspension outwardly from the outer surface, the suspension comprising the plurality of nanocrystals.

13. The method of claim 7, the disposing the plurality of nanocrystals further comprising:
spin-coating a suspension outwardly from the outer surface, the suspension comprising the plurality of nanocrystals.

14. The method of claim 7, further comprising:
disposing a collector layer outwardly from the nanocrystal layer, the collector layer configured to direct the plurality of first photons towards the nanocrystal layer.

15. The method of claim 7, further comprising:
disposing a filter outwardly from the nanocrystal layer, the filter configured to transmit the plurality of first photons and to block the plurality of second photons.

16. An apparatus comprising:
a nanocrystal layer;
a detector layer having a detection band; and
a collector layer configured to:
direct a plurality of photons to the nanocrystal layer;
the nanocrystal layer comprising:
a plurality of nanocrystals operable to:
absorb a plurality of first photons of a higher energy outside of the detection band of the detector layer; and
emit a plurality of second photons of a lower energy within the detection band of the detector layer in response to the absorption;
the detector layer operable to:
detect the plurality of first photons by detecting the plurality of second photons; and
detect a plurality of third photons within the detection band of the detector layer.

17. The apparatus of claim 16, the nanocrystal layer configured to reflect the plurality of first or second photons.

* * * * *